(12) United States Patent
Wager et al.

(10) Patent No.: US 9,989,593 B2
(45) Date of Patent: Jun. 5, 2018

(54) MODULAR TEST ENVIRONMENT FOR A PLURALITY OF TEST OBJECTS

(71) Applicant: Airbus Defence and Space GmbH, Ottobrunn (DE)

(72) Inventors: Philipp Wager, Landshut (DE); Bernd Schumacher, Ingolstadt (DE)

(73) Assignee: Airbus Deference and Space Gmbh, Ottobrunn (DE)

( * ) Notice: Subject to any disclaimer, the term of this patent is extended or adjusted under 35 U.S.C. 154(b) by 260 days.

(21) Appl. No.: 14/783,419

(22) PCT Filed: Apr. 4, 2014

(86) PCT No.: PCT/DE2014/000170
§ 371 (c)(1),
(2) Date: Oct. 8, 2015

(87) PCT Pub. No.: WO2014/166471
PCT Pub. Date: Oct. 16, 2014

(65) Prior Publication Data
US 2016/0054386 A1    Feb. 25, 2016

(30) Foreign Application Priority Data

Apr. 9, 2013    (DE) .................. 10 2013 006 011

(51) Int. Cl.
*G01R 31/319*    (2006.01)
*G01R 31/28*    (2006.01)
*G06F 11/36*    (2006.01)

(52) U.S. Cl.
CPC ....... *G01R 31/319* (2013.01); *G01R 31/2834* (2013.01); *G01R 31/31907* (2013.01); *G06F 11/3664* (2013.01)

(58) Field of Classification Search
None
See application file for complete search history.

(56) References Cited

U.S. PATENT DOCUMENTS

| 4,760,330 A | 7/1988 | Lias, Jr. |
| 2002/0133795 A1* | 9/2002 | Yamada ........... G01R 31/31705 714/731 |

(Continued)

FOREIGN PATENT DOCUMENTS

DE    10 2008 008 933 A1    8/2009

OTHER PUBLICATIONS

International Search Report (PCT/ISA/210) issued in PCT Application No. PCT/DE2014/000170, dated Sep. 15, 2014 (Two (2) pages).

(Continued)

*Primary Examiner* — Daniel Miller
*Assistant Examiner* — Nasima Monsur
(74) *Attorney, Agent, or Firm* — Crowell & Moring LLP

(57) ABSTRACT

The present invention relates to an arrangement for providing a testing environment for the testing of test objects. The testing environment includes a first test object receiving apparatus and a second test object receiving apparatus, each of which are configured to receive a test object. The testing environment also includes a connection interface configured to connect the first test object receiving apparatus and the second test object receiving apparatus to the testing environment. In one embodiment, the first test object receiving apparatus has a first external connection interface, and the second test object receiving apparatus has a second external connection interface, wherein said first and second external connection interfaces are configured to be selectively coupled with the connection interface of the testing environment.

18 Claims, 2 Drawing Sheets

(56) References Cited

U.S. PATENT DOCUMENTS

| | | | | |
|---|---|---|---|---|
| 2005/0262412 A1* | 11/2005 | Mukai | ............... | G01R 31/31907 |
| | | | | 714/742 |
| 2008/0072050 A1* | 3/2008 | Klonover | .............. | H04L 63/029 |
| | | | | 713/176 |
| 2009/0119054 A1* | 5/2009 | Adachi | ............ | G01R 31/31718 |
| | | | | 702/119 |
| 2011/0181309 A1* | 7/2011 | Morita | ............. | G01R 31/31907 |
| | | | | 324/750.3 |
| 2011/0202799 A1* | 8/2011 | Pagani | ............... | G01R 31/3025 |
| | | | | 714/27 |

OTHER PUBLICATIONS

Rajsuman, "An Overview of the Open Architecture Test System", Electronic Design, Test and Applications, 2004. Delta 2004. Second IEEE International Workshop on Perth, Australia Jan. 28-30, 2004, Piscataway, NJ, USA, IEEE, Jan. 28, 2004 (Jan. 28, 2004), 6 pages, XP010778701.

* cited by examiner

MODULAR TEST ENVIRONMENT FOR A PLURALITY OF TEST OBJECTS

FIELD OF THE INVENTION

The invention relates to a testing environment for the testing of test objects, which may be, for example, a technical system, a subsystem of a technical system or another technical component and in particular safety-related component, such as a component of an aircraft or an aircraft computer.

BACKGROUND OF THE INVENTION

After development and before use, technical components may require testing of their behavior in different situations. Such a test may consist of several test cases, wherein each test case has a set of input data and a set of expected output data. Simply put, the input data is applied to the test object and the reaction or the behavior of the test object to this input data is detected. The data thus collected is then compared with the expected output data associated with this test case. A match between the detected data and the expected output data indicates a correct function of the test object in the corresponding test case. A deviation of the detected data from the prescribed and expected output data may indicate a malfunction of the test object.

Under certain circumstances, it may be necessary to adapt a testing environment to a specific test object, whether regarding the mechanical coupling of the test object with the testing environment or the signal coupling of the test object with the testing environment for applying the input data of a test case to the test object and for reading the output data following a test case.

A test case is usually started by a test case execution unit and the execution of the test case is monitored, wherein a single test case execution unit is provided to execute test cases on the test object. If a novel or varied test object is provided for testing in the testing environment, it may be necessary to adapt the testing environment to the varied test object.

SUMMARY OF THE INVENTION

It can be regarded as an object of the invention to provide a testing environment for a variety of test objects.

According to one aspect of the invention, a testing environment for the testing of test objects is provided. The testing environment comprises a first test object receiving apparatus and a second test object receiving apparatus, each of which are designed to receive a test object. The testing environment further comprises a connection interface for connecting the first test object receiving apparatus and the second test object receiving apparatus to the testing environment. The first test object receiving apparatus comprises a first external connection interface, and the second test object receiving apparatus comprises a second external connection interface, said external connection interfaces both being designed to be selectively coupled with the connection interface of the testing environment.

The testing environment thereby enables the testing of different test objects, without thereby necessitating an adjustment of the testing environment to the interfaces of the test objects, as the test objects are coupled with the testing interface via the test object receiving apparatuses. The first external connection interface of the first test object receiving apparatus and the second external connection interface of the second test object receiving apparatus may in particular comprise an identical mechanical and electrical interface for connecting to the connection interface of the testing environment.

The testing environment as described above and below can thus enable, for example, that the testing environment can be used for a variety of test objects, without necessitating an adjustment of the testing environment to the mechanical and electrical interfaces of a novel test object.

According to one embodiment, the access of a test case execution unit to a test object is possible independent of location or time. Being independent of location means that a test case execution unit can access a test object from any location and in particular via remote access from a remote location. In particular a direct line of sight, for example of an operator of the test case execution unit, may not exist between the test object and the remote location. Independent of time means that a test object can be accessed by a test case execution unit at any time.

According to one embodiment, the test objects are spatially separated from each other.

This enables in particular the interaction of several spatially separately arranged test objects in a common test scenario.

According to one embodiment of the invention, a mechanical specification of the first external connection interface corresponds with a mechanical specification of the second external connection interface.

This means that the testing environment and the connection interface of the testing environment are designed to be connected via a fixed and constant mechanical specification with a plurality of test object receiving apparatuses respectively via the external contact interfaces thereof. By a mechanical specification of a connection interface is to be understood, for example, the number of connection points or connection poles, the arrangement of the connection points and the type of mechanical coupling between the first external connection interface and the second external connection interface and the connection interface of the testing environment.

According to a further embodiment of the invention, an electrical specification of the first external connection interface corresponds with an electrical specification of the second external connection interface.

The electrical specification of a connection interface relates to the type of signal transmission over this connection interface, i.e. the voltage level of the signals, the number and the voltage spacing between the individual signal values, if necessary a modulation of the transmitted signals and if necessary the signal encoding of the transmitted signals.

According to a further embodiment of the invention, in addition to the mechanical and electrical specification of the first external connection interface and the second external interface, a signal transmission specification of these two external connection interfaces also corresponds. This may mean, for example, that the external connection interfaces of the test object receiving apparatuses are controlled by the testing environment via a single common command set, or that a data transfer protocol between the testing environment and every test object receiving apparatus is identical.

In other words, the invention enables the provision of a unified testing environment with a predetermined specification of the connection interface to a plurality of test object receiving apparatuses, which test object receiving apparatuses can respectively receive and accommodate individually designed test objects.

According to a further embodiment of the invention, the first test object receiving apparatus comprises a first internal interface and the second test object receiving apparatus comprises a second internal interface, wherein the second internal interface deviates from the first internal interface. The first internal interface is designed here to be coupled with a first test object, and the second internal interface is designed to be coupled with a second test object, which deviates from the first test object.

The fact that the first internal interface is different from the second internal interface means that these two internal interfaces differ from one another in at least one aspect of their specification, i.e. the mechanical, electrical or signal transmission specification. Accordingly, this also means for the deviation of the first test object from the second test object that the first test object deviates from the second test object in at least one aspect of the described specification. The test objects may also differ in that they perform different functions and are driven by means of different command sets.

According to a further embodiment of the invention, a mechanical specification of the first internal interface deviates from a mechanical specification of the second internal interface.

According to a further embodiment of the invention, an electrical specification of the first internal interface deviates from an electrical specification of the second internal interface.

According to a further embodiment of the invention, a signal transmission specification of the first internal interface deviates from a signal transmission specification of the second internal interface.

For the mechanical, electrical and signal transmission specification of the first and second internal interface, the previous writing with respect to the first and second external connection interfaces of the test object receiving apparatus applies analogously.

The internal interface of a test object receiving apparatus is thus designed to be coupled with a test object, and the external connection interface of the test object receiving apparatus is designed to be coupled therewith via a unified connection interface of the testing environment. In other words, the testing environment enables with such a test object receiving apparatus the coupling and testing of diverse and varied test objects in a testing environment via a constant connection interface of the testing environment, i.e. that the test object receiving apparatus encapsulates the mechanical, electrical and signal transmission specification of a test object and enables the testing environment to address the test object via uniform and predetermined external connection interfaces of the test object receiving apparatuses.

According to a further embodiment of the invention, the first test object receiving apparatus comprises a signal interface, which is designed to mechanically and electrically couple the first internal interface with the first external connection interface.

The signal interface thus receives on one side the signals from the testing environment, converts these mechanically and electrically and outputs them on the other side to the test object. Of course, this applies mutatis mutandis to the transmission of signals in the other direction, i.e. from the test object to the testing environment, and, in addition to the mechanical and electrical coupling, further applies to the signal transmission coupling of the testing environment with the test object.

According to a further embodiment of the invention, the testing environment comprises a first signal tap. The first test object receiving apparatus comprises a first test signal interface, which mechanically and electrically couples the first internal interface with the first signal tap.

The signal tap enables the reading of test and diagnostic signals, such as signals regarding the operating condition of the test object. These test and diagnostic signals may be information regarding the operating condition of the test object, which may be monitored in addition to the output data of the test object which is used for the test case.

According to a further embodiment of the invention, the second test object receiving apparatus comprises a second test signal interface, which mechanically and electrically couples the second internal interface with the second signal tap, wherein the first test signal interface and the second test signal interface comprise a matching electrical specification, via which they are coupled with the testing environment.

Thus, in addition to a unified possibility of the execution of a test case and the evaluation of the test case data of a test object, the above- and below-described testing environment commands the possibility of a unified tapping of test and diagnostic signals regarding the operating condition of various test objects.

According to a further embodiment, the first test signal interface and the second test signal interface comprise a matching mechanical specification, via which they are coupled with the testing environment.

The above- and below-described testing environment enables that different and varying test objects, which in particular command changing input and output interfaces, are encapsulated or enclosed in a test object receiving apparatus, so as to initially separate the interfaces of the test object from the testing environment. The test object receiving apparatus comprises an internal interface which is adapted to the test object, and an external interface which is adapted to the testing environment. In a change of the interfaces of a test object, it may therefore in particular be sufficient to provide a test object receiving apparatus which is adapted to the input and output interfaces of the test object, without necessitating an adaptation of the testing environment as a whole to the test object.

The test objects may be any technical components, for example technical components with moving parts or control and controller devices, which are configured for monitoring a technical process. The test objects may in particular be components of safety-related systems, for example components which are used in manned or unmanned aviation.

DETAILED DESCRIPTION OF THE EXEMPLARY EMBODIMENTS

Figure 1:
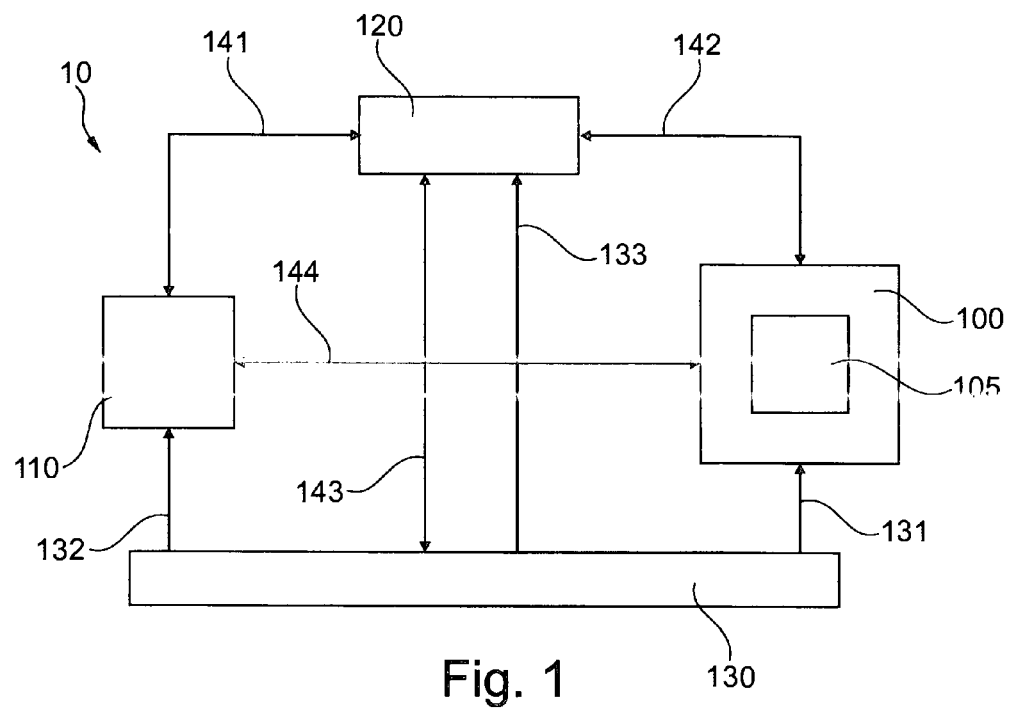
FIG. 1 shows a schematic representation of a testing environment according to an embodiment of the invention.

The representations in the figures are schematic and not to scale. When like reference characters are used in the following description of the figures, these refer to the same or similar elements.

FIG. 1 shows a testing environment 10 with a test case execution unit 110 and a test object 105, which is arranged in a test object receiving apparatus 100. A controller 120 is provided on the one hand to control the test case execution unit 110, and on the other to control the test object receiving apparatus 100 and the test object 105. Likewise, the controller 120 controls a power supply unit 130, which supplies the test case execution unit 110, the test object receiving apparatus 100 and the test object 105 as well as the controller 120 with energy for executing a test.

The unidirectional arrows 131, 132, 133 schematically illustrate the power supply of the test object receiving apparatus 100, the test case execution unit 110 and the controller 120. The direction of the arrows indicates here the direction of the provision of energy. The bi-directional arrows symbolize data connections between the respective components. The controller 120 has a data connection 141 to the test case execution unit 110, a data connection 142 to the test object receiving apparatus 100 and to the test object 105 arranged therein and a data connection 143 to the power supply unit 130. The control of the entire testing environment and testing scenario takes place via these data connections.

In addition, a data connection 144 also exists between the test case execution unit 110 and the test object receiving apparatus 100, wherein by means of this data connection 144 the actual test case is initiated and executed by the test case execution unit 110 and the output data of the test object 105 is received.

The test case execution unit 110 is designed to exchange data with the test object receiving apparatus 100 via a predetermined mechanical and electrical link 144. This data is adapted by the test object receiving apparatus 100 to the interface of the test object 105, so that, in the case of a novel test object, only the test object receiving apparatus 100 must be adapted to the mechanical and electrical interface of the test object, wherein the connection both with respect to the mechanical as well as the electrical interface to the test case execution unit 110 can be maintained. In other words, there occurs hereby a so-called encapsulation of the mechanical, electrical and signal interfaces of the test object 105 by means of the test object receiving apparatus 100, so that, in the case of a new test object, only the test object receiving apparatus 100 must be adapted to the test object, without thereby adapting the mechanical, electrical and signal transmission interfaces of the test object receiving apparatus to the test case execution unit. The creation and qualification of a testing environment as a whole can thus largely be prevented if a novel test object is to be tested. By so-called qualification of the testing environment is here understood the checking of the testing environment for proper operation.

Figure 2:
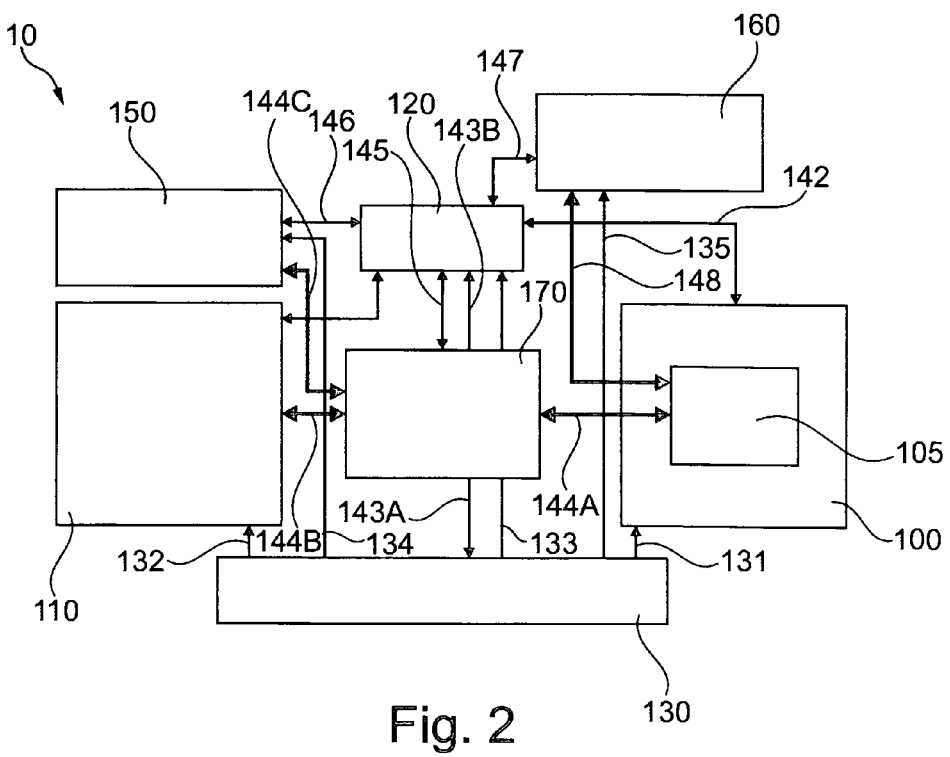
FIG. 2 shows a schematic representation of a testing environment according to a further embodiment of the invention.

FIG. 2 shows a testing environment 10, comprising in addition to the components already shown in FIG. 1 an additional simulation hardware unit 150 and an input/output element 160 and a connection station 170.

The connection station 170 is designed to couple the test case execution unit 110, the simulation hardware unit 150 and the test object 105 located in the test object receiving apparatus 100 with one another. The coupling between these components is controlled between the controller 120 and the connection station 170 via the controller 120 and the data connection 145.

The input/output elements 160 serve for locally controlling the test object 105 via the data connection 148. Hereby, the test object can for example be switched on or switched off or deactivated in case of emergency. Likewise, an operating mode of the test object can be prescribed via the elements 160.

In contrast to this control of the test object via the input/output elements 160, which are mounted in close proximity or even in sight of the test object 105, the initiation and execution of a test case by means of a test case execution unit 110 via the data connection 144A, 144B may also take place via remote access. This means that the test case execution unit 110 is arranged spatially separately from the test object and the connection is established between the test object and the test case execution unit, for example, via a public or private data network.

Just as the test case execution unit 110 may be arranged spatially separately from the test object 105, the simulation hardware unit 150 may also be arranged spatially separately from the test object 105. This enables, for example, the common use of only one provided simulation hardware unit 150 by a plurality of different test objects 105, of which all may be placed remotely in different locations and independently from the simulation hardware unit 150.

It is again clear here that the above- and below-described testing environment 10 enables a multiple usage of components, for example the simulation hardware unit 150, as well as a sequential multiple access of a plurality of users, which are spatially separated from one another and from the test object, to a test object.

Figure 3:
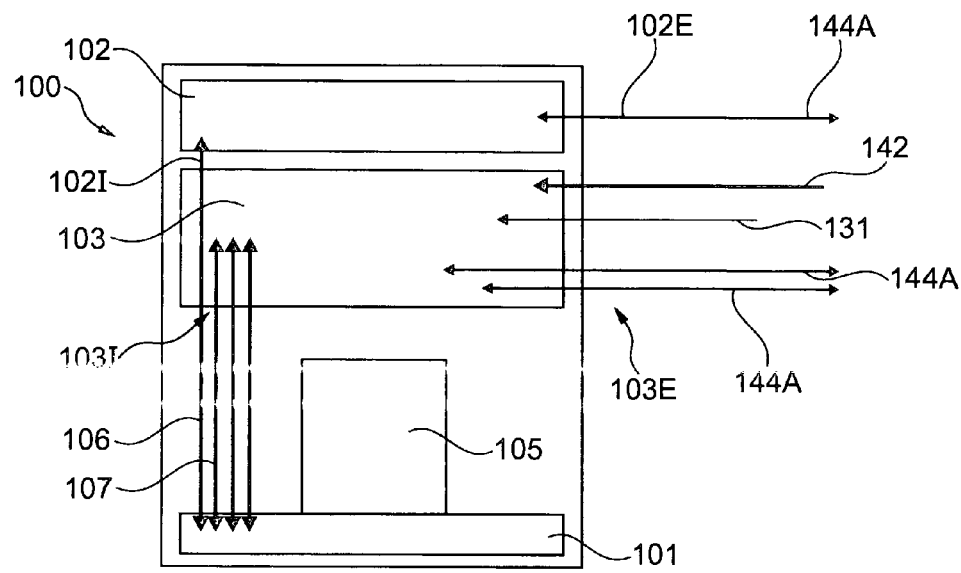
FIG. 3 shows a schematic representation of a test object receiving apparatus of a testing environment according to a further embodiment of the invention.

FIG. 3 shows a test object receiving apparatus 100 with a test object 105. The test object 105 is mechanically and electrically coupled with a receiving element 101. The receiving element 101 thus forms the interface of the test object receiving apparatus to the test object 105, and is respectively adapted to the mechanical, electrical and signal transfer conditions for the connection with the test object 105.

The test object receiving apparatus 100 additionally comprises a test signal interface unit 102 and a signal interface unit 103. The signal interface unit 103 is designed to take over signals from the test object 105 via an internal interface 1031 by means of the receiving element 101, process and convert these signals and output them via an external interface 103E by means of the data connection 114A to the connection station 170. The signals from the test object are transferred from the receiving element 101 via a data connection 107 to the signal interface unit 103.

The test object receiving apparatus 100 may optionally comprise a test signal interface unit 102, which receives signals from the receiving element 101 via an internal interface 1021 by means of the data connection 106, evaluates and if necessary converts these signals, and outputs them via the external interface 102E and the data connection 144A.

The test signal interface unit 102 is optional and enables the connection of a diagnostic unit to the test object receiving apparatus, wherein the diagnostic unit evaluates and analyzes test signals of the test object.

The signal interface unit 103 is further connected via the line 131 with the power supply unit 130 and via the data connection 142 with the controller 120.

In one embodiment, the test object receiving apparatus 100 may be an enclosed unit for operating the test object 105 embedded therein. The receiving element and the interface for connecting the test object are used for the mechanical, electrical and signal transmission adaptation and coupling of the test object. In addition, the receiving element 101 may include further functions, such as a cooling function, in order to carry away heat resulting during the operation of the test object. The test object is mounted or fixed on the receiving element, and the interfaces of the test object are transferred from the receiving element via the data connections 106, 107 to the test signal interface unit 102 and the signal interface unit 103. In addition to operation interface connections, the test object 105 may also comprise diagnostic or programming interface connections. Here, the operation interfaces are discreetly connected with the signal interface unit and the diagnostic or programming interfaces are discretely connected to the test signal interface unit 102. The test signal interface unit is optional and is used, for example, for troubleshooting, or may be used for the import of control programs to the test object. The signal interface unit 103 leads all operation interface connections of the test object via the external interface 103E out of the test object receiving apparatus 100. This leading out of the interfaces of the test object from the test object receiving apparatus may occur both in a discretely cabled manner, for instance via a standard connector, as well as logically via a bus system. Being discretely cabled means here that a signal line is also allocated a physical line, and in contrast thereto, in a logical connection a plurality of connections are led via a common physical line. In one embodiment, a logical connection may be associated with a signal conversion, for instance with a change in the signal encoding or with an analog-to-digital conversion.

Figure 4:
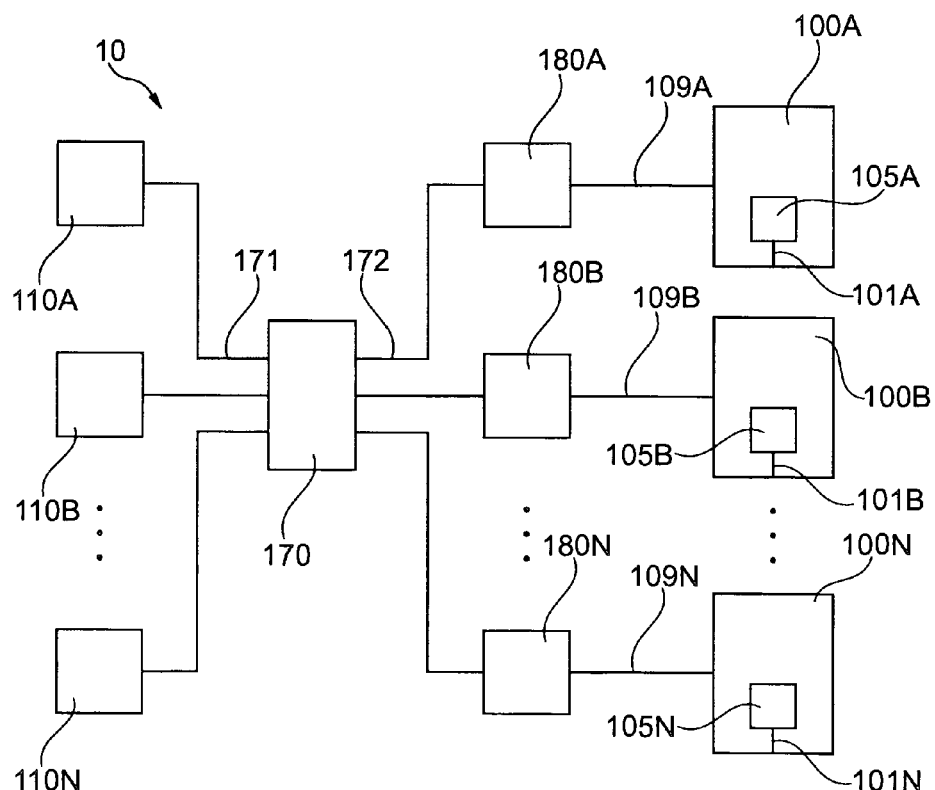
FIG. 4 shows a schematic representation of a testing environment according to a further embodiment of the invention.

FIG. 4 shows a schematic illustration of a testing environment 10 with a plurality of test case execution units 110A, 110B, 110N, a plurality of test object receiving apparatuses 100A, 100B, 100N, each having a test object 105A, 105B, 105N, wherein each test object is connected via a respective receiving element 101a, 101b, 101N with the respective test object receiving apparatus, and wherein each test object receiving apparatus is connected via an external connection interface 109A, 109B, 109N by means of a respective signal tap 180A, 180B, 180N with the connecting station 170.

The test case execution units 110 are respectively connected to the connecting station via an input interface 171, and the test object receiving apparatuses 100 respectively via an output interface 172. As already described above, the connection station is designed to connect each input interface with one or more output interfaces, wherein an output interface may be connected with only a single input interface at a time.

The test signal interface unit 102 of the test object receiving apparatus 100 may be connected with its external interface 102E to the signal tap associated with this test object receiving apparatus, so that the tapping of test signals for diagnostic purposes may occur via the signal tap 180A, 180B, 180N.

For reasons of clarity, the representation of a simulation hardware unit has been omitted in FIG. 4. It should therefore particularly be noted that a plurality of test case execution units 110, a plurality of test object receiving apparatuses 100 and a plurality of simulation hardware units 150, as is shown in FIG. 2, may be connected with the connection station 170. A test case execution unit may thereby be connected via the connection station with one or more test object receiving apparatuses for the execution of a test case. In addition, a test object receiving apparatus and the test object contained therein may be coupled via the connection station with a simulation hardware unit or a plurality of simulation hardware units.

In one embodiment, a direct coupling of the test objects with one another is also possible via the connection station 170. Thus, in addition to a single test object, a group of interacting test objects can also be tested. Interaction between test objects refers here, for example, to a connection in which two or more test objects exchange data with one another, one test object requests data from another test object, or a test object elicits actions in another test object or transmits the result of an action to another test object.

The connection station also enables the coupling of spatially separately arranged test objects for a common test scenario.

The above- and below-described testing environment thus enables a simultaneous multiple access to spatially separate or non-separate test objects from a test case execution unit or through a user, a time-sequential access by multiple users or multiple test case execution units to the same test object, a simultaneous access of a test object to multiple simulation hardware units, which may be spatially separate or non-separate, and finally a time-sequential access of multiple different test objects to this simulation hardware unit. A resource-saving use of the components of the testing environment is thus enabled, and in particular a new, individually tailored testing environment need not be created and qualified for every test object.

The invention claimed is:

1. An arrangement for providing a testing environment for the testing of test objects, the testing environment comprising:
   a first test object receiving apparatus and a second test object receiving apparatus, each of which are configured to receive a test object, wherein the first test object receiving apparatus comprises a first internal interface and the second test object receiving apparatus comprises a second internal interface, wherein each of the first internal interface and the second internal interface comprises a mechanical interface specification, an electrical interface specification, and a signal transmission interface specification, wherein at least one of the mechanical interface, electrical interface and signal transmission interface specifications of the first internal interface differs from the respective mechanical interface, electrical interface and signal transmission interface specifications of the second internal interface, and wherein the first internal interface is coupled with a first test object and the second internal interface is coupled with a second test object, which differs from the first test object;
   predetermined mechanical and electrical interfaces of a test case execution circuit which are configured to exchange data with the first and second test object receiving apparatus, wherein the first and second test object receiving apparatus are configured to adapt the data to the first and second internal interface of the first and second objects such that, in the case of a novel test object, only the first and second test object receiving apparatus must be adapted to the predetermined mechanical and electrical interfaces of the first and second test object, wherein a connection with respect to both the predetermined mechanical and the electrical interface to the test case execution circuit is maintained; and
   a connection interface configured to connect the first test object receiving apparatus and the second test object receiving apparatus to the testing environment, wherein the first test object receiving apparatus comprises a first external connection interface, and the second test object receiving apparatus comprises a second external connection interface, wherein said first and second external connection interfaces are configured to be selectively coupled with the connection interface of the testing environment, and wherein the test object receiving apparatus encapsulates the test object with respect to the test case execution circuit, and wherein the test object receiving apparatus acts as an adapter between the test case execution circuit and the test object.

2. The arrangement according to claim 1, wherein the mechanical interface specification of the first external connection interface corresponds with the mechanical interface specification of the second external connection interface.

3. The arrangement according to claim 1, wherein the electrical interface specification of the first external connection interface corresponds with the electrical interface specification of the second external connection interface.

4. The arrangement according to claim 2, wherein the electrical interface specification of the first external connection interface corresponds with the electrical interface specification of the second external connection interface.

5. The arrangement according to claim 1, wherein the mechanical interface specification of the first internal interface deviates from the mechanical interface specification of the second internal interface.

6. The arrangement according to claim 1, wherein the electrical interface specification of the first internal interface deviates from the electrical interface specification of the second internal interface.

7. The arrangement according to claim 5, wherein the electrical interface specification of the first internal interface deviates from the electrical interface specification of the second internal interface.

8. The arrangement according to claim 1, wherein the first test object receiving apparatus further comprising:
a signal interface which is configured to mechanically and electrically couple the first internal interface with the first external connection interface.

9. The arrangement according to claim 1, wherein the first test object receiving apparatus further comprising: a signal interface which is configured to mechanically and electrically couple the first internal interface with the first external connection interface.

10. The arrangement according to claim 1, further comprising:
a first signal tap;
wherein the first test object receiving apparatus comprises a first test signal interface, which mechanically and electrically couples the first internal interface with the first signal tap.

11. The arrangement according to claim 1, further comprising: a first signal tap; wherein the first test object receiving apparatus comprises a first test signal interface, which mechanically and electrically couples the first internal interface with the first signal tap.

12. The arrangement according to claim 7, further comprising:
a first signal tap;
wherein the first test object receiving apparatus comprises a first test signal interface, which mechanically and electrically couples the first internal interface with the first signal tap.

13. The arrangement according to claim 10, wherein the second test object receiving apparatus comprises a second test signal interface, which mechanically and electrically couples the second internal interface with the second signal tap; wherein the first test signal interface and the second test signal interface comprise a matching electrical interface specification, via which the first and second test signal interfaces are coupled with the testing environment.

14. The arrangement according to claim 11, wherein the second test object receiving apparatus comprises a second test signal interface, which mechanically and electrically couples the second internal interface with the second signal tap; wherein the first test signal interface and the second test signal interface comprise a matching electrical interface specification, via which the first and second test signal interfaces are coupled with the testing environment.

15. The arrangement according to claim 12, wherein the second test object receiving apparatus comprises a second test signal interface, which mechanically and electrically couples the second internal interface with the second signal tap; wherein the first test signal interface and the second test signal interface comprise a matching electrical interface specification, via which the first and second test signal interfaces are coupled with the testing environment.

16. The arrangement according to claim 13, wherein the first test signal interface and the second test signal interface comprise a matching mechanical interface specification, via which the first and second test signal interfaces are coupled with the testing environment.

17. The arrangement according to claim 14, wherein the first test signal interface and the second test signal interface comprise a matching mechanical interface specification, via which the first and second test signal interfaces are coupled with the testing environment.

18. The arrangement according to claim 15, wherein the first test signal interface and the second test signal interface comprise a matching mechanical interface specification, via which the first and second test signal interfaces are coupled with the testing environment.

* * * * *